(12) United States Patent
Clevenger et al.

(10) Patent No.: US 8,043,886 B2
(45) Date of Patent: Oct. 25, 2011

(54) METHODS FOR MANUFACTURING A CONTACT GRID ON A PHOTOVOLTAIC CELL

(75) Inventors: Lawrence A. Clevenger, LaGrangeville, NY (US); Harold J. Hovel, Katonah, NY (US); Rainer K. Krause, Mainz-Kostheim (DE); Kevin M. Prettyman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/849,648

(22) Filed: Aug. 3, 2010

(65) Prior Publication Data
US 2010/0317148 A1    Dec. 16, 2010

Related U.S. Application Data

(62) Division of application No. 12/234,856, filed on Sep. 22, 2008.

(51) Int. Cl.
*H01L 21/283* (2006.01)

(52) U.S. Cl. .............. 438/98; 136/256; 427/510

(58) Field of Classification Search ........... 136/243–265
See application file for complete search history.

(56) References Cited

U.S. PATENT DOCUMENTS

| | | | |
|---|---|---|---|
| 3,686,036 A * | 8/1972 | Gereth et al. | 136/256 |
| 4,451,969 A * | 6/1984 | Chaudhuri | 438/62 |
| 4,726,850 A | 2/1988 | Wenham et al. | |
| 7,041,436 B2 | 5/2006 | Krause et al. | |
| 7,339,110 B1 * | 3/2008 | Mulligan et al. | 136/256 |
| 7,629,257 B2 * | 12/2009 | Klein et al. | 438/689 |
| 2005/0170621 A1 | 8/2005 | Kim et al. | |
| 2005/0189015 A1 | 9/2005 | Rohatgi et al. | |
| 2005/0221613 A1 | 10/2005 | Ozaki et al. | |
| 2007/0148336 A1 | 6/2007 | Bachrach et al. | |
| 2008/0216893 A1 | 9/2008 | Russell et al. | |
| 2009/0139421 A1 * | 6/2009 | Nakagawa | 101/465 |
| 2010/0001434 A1 * | 1/2010 | Atkin | 264/293 |
| 2010/0163101 A1 * | 7/2010 | Kumar et al. | 136/256 |

FOREIGN PATENT DOCUMENTS

WO    2007-067304 A2    6/2007

* cited by examiner

*Primary Examiner* — Jennifer K. Michener
*Assistant Examiner* — Jayne Mershon
(74) *Attorney, Agent, or Firm* — Lieberman & Brandsdorfer, LLC

(57) ABSTRACT

Processes for fabricating a contact grid for a photovoltaic cell generally includes providing a photovoltaic cell having an antireflective coating disposed on a sun facing side, the photovoltaic cell comprising a silicon substrate having a p-n junction; soft stamping a pattern of a UV sensitive photoresist and/or polymer onto the antireflective coating; exposing the UV sensitive photoresist and/or polymer to ultraviolet radiation to cure the UV sensitive photoresist and/or polymer; etching the pattern to form openings in the antireflective coating that define the contact grid; stripping the UV sensitive photoresist and/or polymer; and depositing a conductive metal into the openings defined by the pattern. The metal based paste can be aluminum based, which can be annealed at a relatively low temperature.

14 Claims, 3 Drawing Sheets

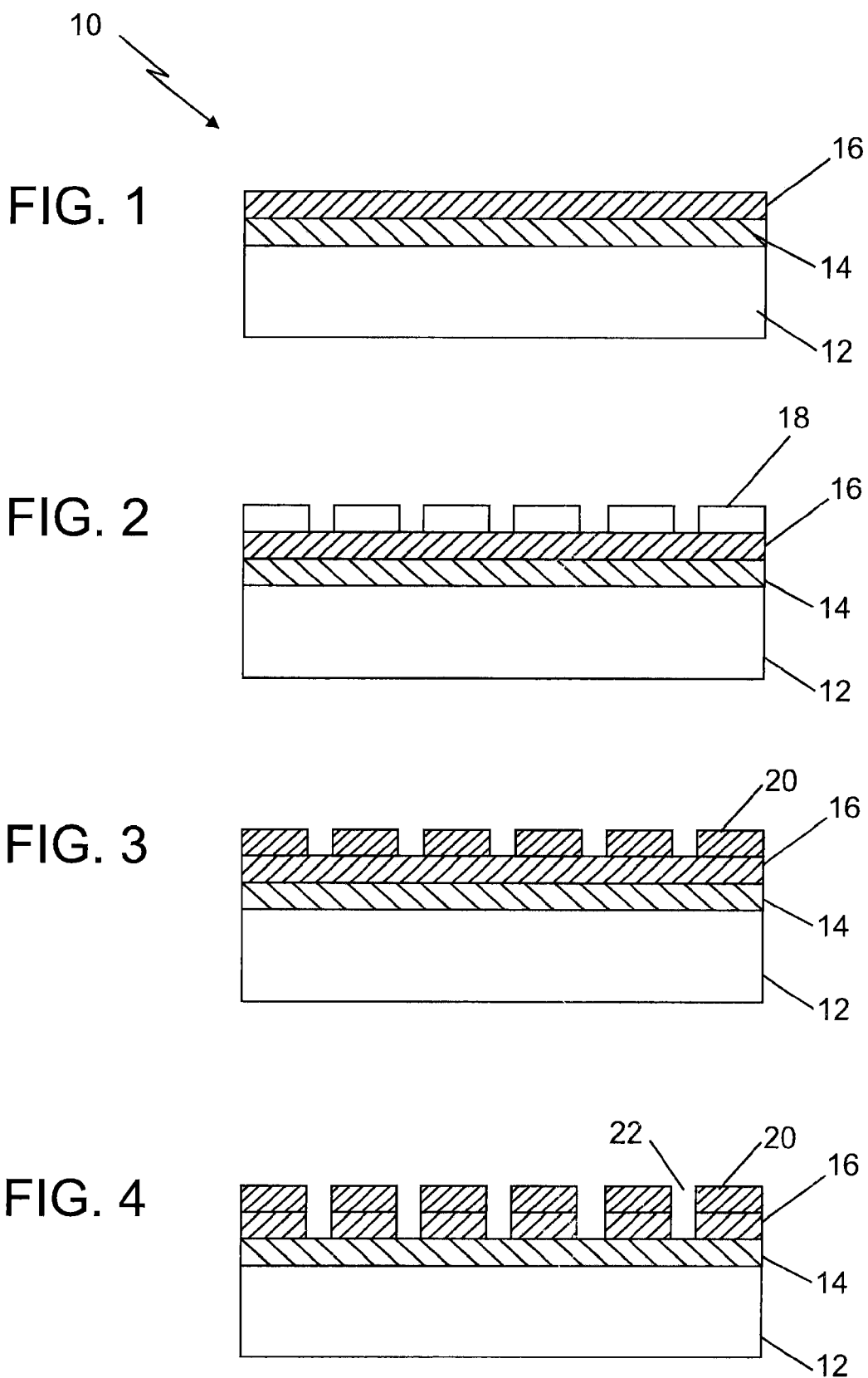

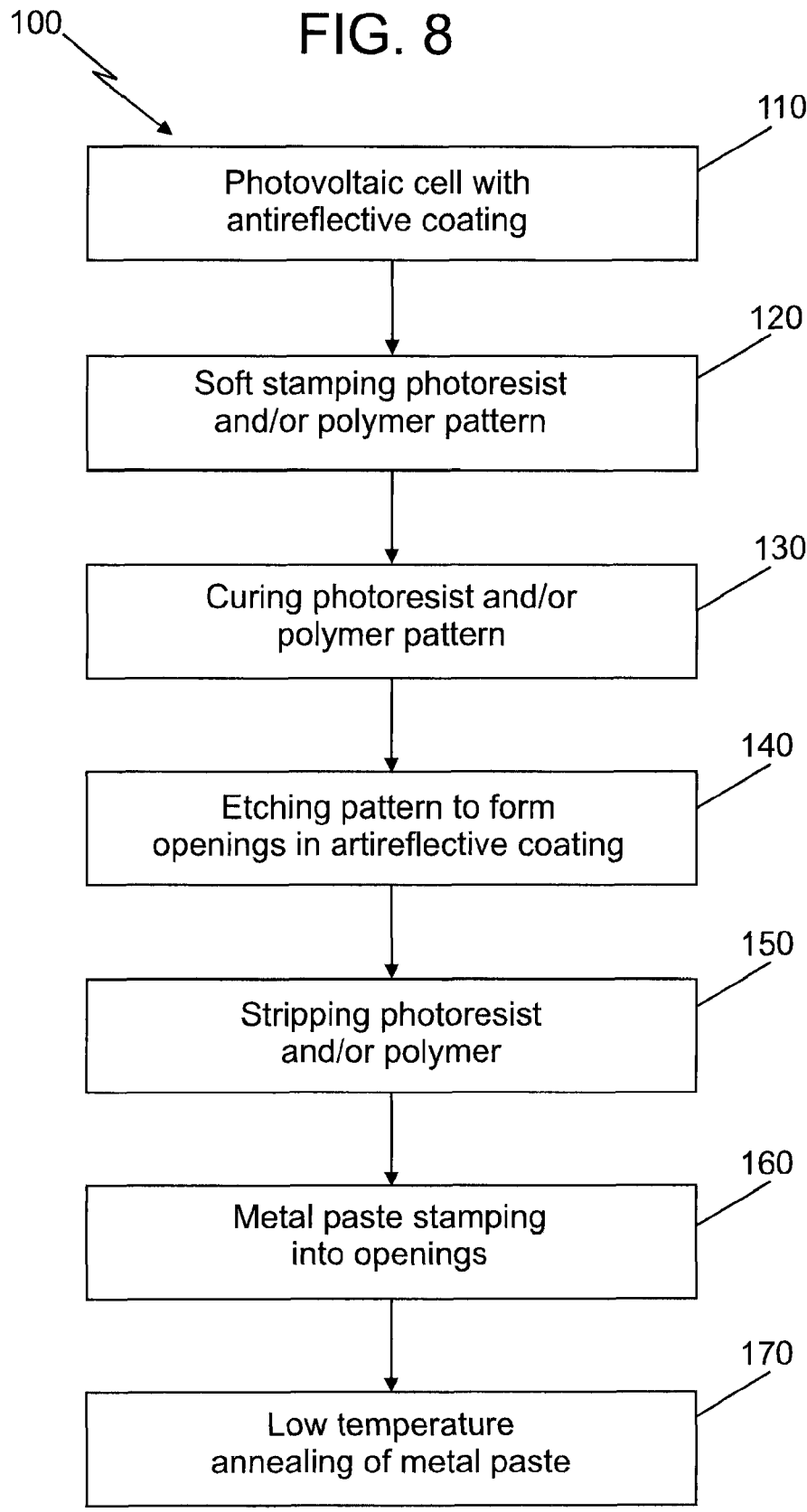

METHODS FOR MANUFACTURING A CONTACT GRID ON A PHOTOVOLTAIC CELL

CROSS REFERENCE TO RELATED APPLICATION(S)

This application is a division of application Ser. No. 12/234,856, filed Sep. 22, 2008, now pending, which is hereby incorporated herein by reference.

BACKGROUND

The invention relates to photovoltaic cells, and more particularly, to methods for manufacturing a contact grid including bus bars on a photovoltaic cell.

Current photovoltaic cells such as solar cells are covered with a metallic contact grid for transporting current and minimizing current loses due to resistance through underlying silicon-containing layers. The patterns of conductive metal lines that define the metallic contact grid and/or bus bars are generally screen printed using thick film technology to layer a conductive paste of metal materials into a desired pattern. The metal paste, typically silver, is dried and then fired, i.e., sintered, at relatively high temperatures. Problems related to current processes include the costs associated with the use of silver, which is relatively high and that the solar efficiency of the photovoltaic cell can be degraded during the annealing process because of the high temperatures currently used to effect sintering of the silver paste. For example, once the silver paste is screen printed, the annealing step typically occurs at temperatures of about 900° C. for an extended period of time, typically about an hour or more, which can cause the degradation.

Accordingly, there is a need for improved manufacturing processes that are less expensive and less prone to degradation.

BRIEF SUMMARY

The shortcomings of the prior art are overcome and additional advantages are provided through the provision of manufacturing process that utilizes a relatively low temperature firing and soft stamping process for forming the contact grid and/or bus bars. In one embodiment, a process for fabricating a contact grid for a photovoltaic cell comprises providing a photovoltaic cell having an antireflective coating disposed on a sun facing side, the photovoltaic cell comprising a silicon substrate having a p-n junction; soft stamping a pattern of a UV sensitive photoresist and/or polymer onto the antireflective coating; exposing the UV sensitive photoresist and/or polymer to ultraviolet radiation to cure the UV sensitive photoresist and/or polymer; etching the pattern to form openings in the antireflective coating that define the contact grid; stripping the UV sensitive photoresist and/or polymer; and depositing a conductive metal into the openings defined by the pattern.

In another embodiment, a process for fabricating a contact grid for a photovoltaic cell comprises providing a photovoltaic cell having an antireflective coating disposed on a sun facing side, the photovoltaic cell comprising a silicon substrate having a p-n junction; stamping a pattern of a photoresist and/or polymer onto the antireflective coating; curing the photoresist and/or polymer; etching the pattern in the antireflective coating to form openings that define the contact grid; stripping the UV sensitive photoresist and/or polymer; stamping an aluminum based metal paste into the openings of the pattern by dipping a stamp into the aluminum based metal paste, wherein the stamp comprises a plurality of projections corresponding to the openings having a diameter and/or width smaller than the openings; stamping the projections into the openings; and filling the openings with the metal paste; and annealing the aluminum based metal paste.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 1-7 depict an exemplary process for fabricating contact grids for a photovoltaic cell; and FIG. 8 illustrates a flowchart describing an exemplary process for fabricating contact grids for a photovoltaic cell.

Figure 5:
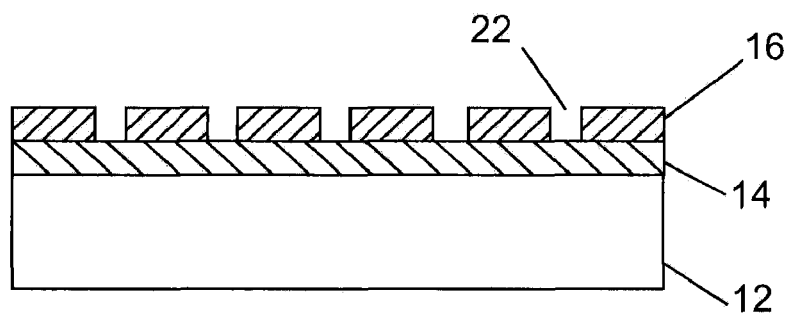

The detailed description explains the preferred embodiments of the invention, together with advantages and features, by way of example with reference to the drawings.

DETAILED DESCRIPTION

Before describing the present invention in detail, it is to be understood that the terminology used herein is for the purpose of describing particular embodiments only, and is not intended to be limiting. It must be noted that, as used in this specification and the appended claims, the singular forms "a," "an," and "the" include plural referents unless the context clearly dictates otherwise.

Disclosed herein are methods for forming the contacts including bus bars where applicable onto photovoltaic cells at a stage in the manufacturing process subsequent to formation of the junctions, wherein the photovoltaic cell includes an antireflective coating disposed over the junction. The process is economical and provides lower annealing temperatures, thereby substantially preventing solar efficiency degradation.

Photovoltaic cells are generally formed on a silicon substrate 12, typically a p type boron doped substrate. The junctions can be formed by diffusing an n type dopant 14 onto the p type silicon substrate via phosphorous diffusion. One example of phosphorous diffusion includes coating phosphosilicate glass compounds onto the surface of the p-type silicon substrate and subsequently annealing in a furnace to effect diffusion. Once the p-n junction is formed, the antireflective coating 16 is commonly provided on the front or sun facing side so as to reduce reflection losses of photons. The resulting photovoltaic structure 10 at this stage in the manufacturing process is generally shown in FIG. 1

As will be described in detail herein, the process for forming the contacts including the bus bars includes the use of a soft stamping process. In the soft stamping process, a stamp master, which is typically fabricated from a quartz material, is employed and represents a negative of the desired contact pattern. A soft stamp is formed from the stamp master by coating/depositing a UV sensitive soft stamp material. As used herein, the term "soft" when describing a stamp or its material is a relative term which denotes a stamp or material that can more easily deform around substrate features than a rigid stamp. In this manner, the soft stamp can be used to secure accurate stamping on uneven surfaces. In one embodiment, the UV sensitive soft stamp material is compliant and made of a soft elastomeric material. A non-limiting example of a suitable stamp material is polydimethylsiloxane (PDMS), which is subsequently cured to form the soft stamp. Other suitable materials are those with equivalent properties as the PMDS. Examples include, without limitation, various urethanes and optical adhesives. The stamp master can be utilized to form multiple soft stamps as may be desired. The resulting soft stamp itself can be cleaned with an aqueous solution after each stamping process.

The softness of the stamp is generally dependent upon substrate features. For example, for most PDMS, a suitable material for a soft stamp, the value of E (Young's modulus) is within the range of about 0.1 to about 10 MPa, and the value of G (shear modulus) is less than or equal to about 1 MPa. On the other hand, for silicon, a suitable material for a rigid stamp, the value of E (Young's modulus) is equal to about 130 GPa, and the value of G (shear modulus) is equal to about 30 GPa. These values for E and G for a soft and rigid stamp are only representative values, and they do not establish nor limit suitable ranges for values of E and G for a soft and rigid stamp.

As shown in FIG. 2, a UV sensitive photoresist and/or polymer 18 is soft stamped onto the surface of the antireflective coating 16 using the stamp. The stamp has the pattern of the contact grid including the bus bars being used to contact the front surface of the substrate and is coated with the UV sensitive photoresist and/or polymer. The patterned UV sensitive resist/polymer 18 is then transferred by the stamp onto the antireflective coating 16 and subsequently UV cured to form a UV cured photoresist/polymer 20 as shown in FIG. 3.

In FIG. 4, openings 22 are then selectively etched into the antireflective coating 16 to the n-doped silicon layer 14 using the UV cured photoresist and/or polymer 20 pattern as a mask. The etching process is not intended to be limited to any particular type and is well within the skill of those in the art. For example, a phosphoric acid based wet etching chemistry can be used that provides the desired selectivity to form the openings extending through the antireflective layer to the underlying silicon layer.

After the openings 22 are formed, the UV cured photoresist and/or polymer 20 is stripped from the substrate such as by, for example, using a hydrofluoric acid etching chemistry so as to provide the structure as shown in FIG. 5.

Figure 6:
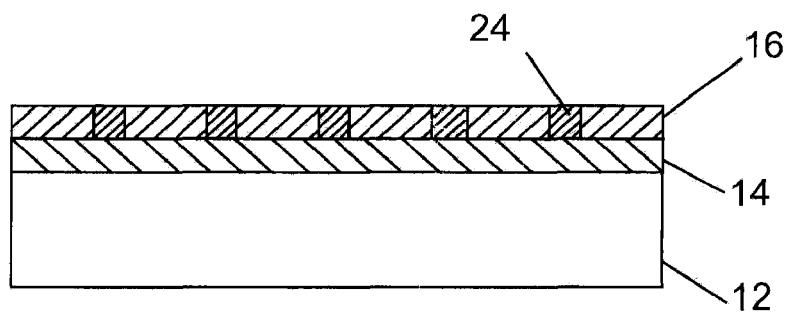

In FIG. 6, a metal paste 24 is stamped into the openings. In this application, the stamp includes projections that are narrower than the openings 24 in which it is stamped. That is, the stamp projection width and/or diameter is less than the width and/or diameter of the opening. The stamp is dipped into the metal paste and subsequently inserted into the opening 24, thereby transferring the metal paste into the opening. The viscosity of the metal paste 24 is selected so as to permit the opening 22 to be filled with the metal paste upon removal of the stamp from the opening. In one embodiment, the metal paste is aluminum based, which permits the use of lower annealing temperatures relative to silver based metal pastes. For example, a suitable metal paste is an AlNi based paste, which effectively lowers the annealing temperature to less than 400° C.

Figure 7:
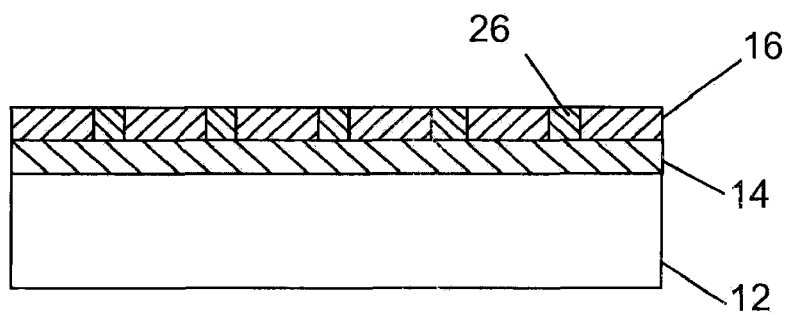

The aluminum based metal paste 24 is then annealed at a low temperature to form an annealed metal 26 as shown in FIG. 7. The annealed metal secures good contact at low resistance to the n-doped silicon surface 14 to provide the photovoltaic cell with contact grid and bus bars. In one embodiment, the annealing temperature is less than 400° C. to greater than 300° C. for a period of 0.5 h; in another embodiment, the annealing temperature is less than 380° C. to greater than 320° C. for a period of 0.4 h; and in still other embodiments the annealing temperature is less than 360° C. to greater than 340° C. for a period of 0.25 h. By way of example, the annealing temperature can be 400° C. for 0.2 h.

Alternatively, the metal paste stamping step can occur prior to removal of the UV cured photoresist and/or polymer 20 shown in FIG. 5. In this embodiment, the removal of the polymer layer would take place after metal stamping and annealing. Advantageously, this helps to support the cleanliness throughout the process.

FIG. 8 provides a schematic of the process flow 100. Photovoltaic cells having an antireflective coating are provided in step 110. These cells are pattern stamped using soft stamp technology as shown in step 120. The transferred photoresist and/or polymer is then UV cured as shown in step 130. In step 140, a wet etching process is used to form openings in for the contract grid in the dielectric layer. The polymer is then strip as shown in step 150 and an aluminum based metal paste is stamped into the openings as shown in step 160. In step 170, the aluminum based metal paste is annealed at a relatively low temperature.

Advantageously, the process as described herein is relatively simple and uses minimal capital equipment. The stamping material has a low cost and stamp alignment is generally not an issue since large dimensions are used. The line width, dimension of highest accuracy, to be stamped is at >100 microns where the alignment can be easy realized through simple mechanical fixture holding the soft stamp as well as the solar cell. The annealing temperature is below that where any degradation occurs within the photovoltaic cell. Still further, the process can be established at existing silicon based photovoltaic fabrication facilities without any significant investment and production costs.

The following examples are presented for illustrative purposes only, and are not intended to limit the scope of the invention. Efforts have been made to ensure accuracy with respect to numbers (e.g., amounts, temperature, etc.), but allowance should be made for the possibility of errors and deviations

EXAMPLE 1

In this example, a comparison was made of a typical prior art process that included screen printing, paste drying, and firing to form the contract grid to a process in accordance with the disclosure that included stamping the desired contact grid pattern onto a substrate, curing the UV sensitive polymer, etching the stamped pattern, and an annealing step to form the contact grid.

| Process step (prior art) | Process time (hours) | Process step (new) | Process time (hours) |
|---|---|---|---|
| Mask apply and screen printing | 0.25 | Stamping and curing | 0.25 |
| Paste drying | 0.25 | Etch and clean | 0.5 |
| Firing at 900° C. | 1.5 | Stamping, anneal at 400° C. and strip/clean | 0.75 |

The lead time saving was about 0.5 hours, which is between 15% and 20% of the process lead time. Also, the degradation was less due to the lower annealing temperature used (900° C. →~400° C.). Moreover, with regard to the prior art process, the bulk life time also decreased because the annealing temperature was above 750° C.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A process for fabricating a contact grid for a photovoltaic cell, the process comprising:
    providing a photovoltaic cell having an antireflective coating disposed on a sun facing side, the photovoltaic cell comprising a silicon substrate having a p-n junction;
    soft stamping a UV sensitive material in a negative pattern of a contact grid onto the antireflective coating, the contact grid including bus bars used to contact a front surface of the substrate;
    exposing the UV sensitive photoresist and/or polymer to ultraviolet radiation to cure the UV sensitive photoresist and/or polymer;
    etching openings in the antireflective coating that define the contact grid;
    stripping the UV sensitive photoresist and/or polymer;
    depositing a conductive metal into the openings defined by the antireflective coating; and
    annealing the conductive metal to form an annealed metal securing contact at a low resistance to an n-doped silicon surface of the substrate.

2. The process of claim 1, wherein etching the openings comprises a phosphoric acid based wet etching chemistry.

3. The process of claim 1, wherein stripping the UV sensitive photoresist and/or polymer comprises exposing the UV sensitive photoresist and/or polymer to hydrofluoric acid.

4. The process of claim 1, wherein depositing the conductive metal comprises stamping metal paste into the openings; and annealing the metal paste.

5. The process of claim 4, wherein annealing the metal paste is at a temperature of less than 400° C.

6. The process of claim 4, wherein the metal paste is aluminum based.

7. The process of claim 4, wherein stamping the metal paste into the openings of the antireflective coating comprises dipping a stamp into the metal paste, wherein the stamp comprises a plurality of projections corresponding to the openings having a diameter and/or width smaller than the openings defined by the antireflective coating; inserting the projections into the openings; and filling the openings with the metal paste.

8. The process of claim 7, wherein stamping the metal paste into the openings of the antireflective is subsequent to exposing the UV sensitive photoresist and/or polymer to ultraviolet radiation to cure the UV sensitive photoresist and/or polymer and etching the openings in the antireflective coating and prior to stripping the UV sensitive photoresist and/or polymer.

9. The process of claim 1, wherein annealing the conductive metal provides the photovoltaic cell with contact grid and bus bars.

10. A process for fabricating a contact grid for a photovoltaic cell, the process comprising:
    providing a photovoltaic cell having an antireflective coating disposed on a sun facing side, the photovoltaic cell comprising a silicon substrate having a p-n junction;
    stamping a photoresist and/or polymer in a negative pattern of a contact grid onto the antireflective coating, the contact grid including bus bars used to contact a front surface of the substrate;
    curing the photoresist and/or polymer;
    etching the openings into in the antireflective coating that define the contact grid;
    stripping the UV sensitive photoresist and/or polymer;
    stamping an aluminum based metal paste into the openings of the antireflective coating by dipping a stamp into the aluminum based metal paste, wherein the stamp comprises a plurality of projections corresponding to the openings having a diameter and/or width smaller than the openings; stamping the projections into the openings; and filling the openings with the metal paste; and
    annealing the aluminum based metal paste.

11. The process of claim 10, wherein etching the openings comprises a phosphoric acid based wet etching chemistry.

12. The process of claim 10, wherein stripping the UV sensitive photoresist and/or polymer from the antireflective coating comprises exposing the UV sensitive photoresist and/or polymer to hydrofluoric acid.

13. The process of claim 10, wherein annealing the aluminum based metal paste comprises heating to at a temperature of less than 400° C.

14. The process of claim 10, wherein stamping the aluminum based metal paste into the openings of the antireflective coating is subsequent to curing the UV sensitive photoresist and/or polymer and etching the pattern in the antireflective coating to form the openings and prior to stripping the UV sensitive photoresist and/or polymer.

* * * * *